(12) United States Patent
Lee et al.

(10) Patent No.: US 9,231,593 B2
(45) Date of Patent: Jan. 5, 2016

(54) APPARATUS FOR COMPENSATING FOR PROCESS VARIATION OF RESISTOR IN ELECTRONIC CIRCUIT

(75) Inventors: Jeong-Ho Lee, Suwon-si (KR); Seung-Pyo Hong, Suwon-si (KR); Ju-Ho Son, Suwon-si (KR); Seung-Ho Jang, Incheon (KR); Hyun-Tae Gill, Seoul (KR); Joon-Hee Lee, Goyang-si (KR); Yi-Ju Roh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/270,384

(22) Filed: Oct. 11, 2011

(65) Prior Publication Data

US 2012/0086506 A1 Apr. 12, 2012

(30) Foreign Application Priority Data

Oct. 11, 2010 (KR) .......................... 10-2010-098593

(51) Int. Cl.
*H03L 5/00* (2006.01)
*H03K 19/003* (2006.01)
(52) U.S. Cl.
CPC .................. *H03K 19/00384* (2013.01)

(58) Field of Classification Search
CPC ............................... H03K 17/14; H03K 17/56
USPC .......... 327/355–361, 326, 308; 455/323, 326; 333/81 R
See application file for complete search history.

(56) References Cited

U.S. PATENT DOCUMENTS

| | | | | |
|---|---|---|---|---|
| 6,127,877 | A * | 10/2000 | Gabara | 327/362 |
| 6,204,724 | B1 * | 3/2001 | Kobatake | 327/541 |
| 6,492,709 | B2 * | 12/2002 | Olson | 257/536 |
| 6,756,812 | B2 * | 6/2004 | Nagano et al. | 326/60 |
| 6,812,735 | B1 * | 11/2004 | Pham | 326/30 |
| 6,836,170 | B2 * | 12/2004 | Kitagawa et al. | 327/308 |
| 7,034,606 | B2 * | 4/2006 | Caresosa et al. | 327/563 |
| 7,262,659 | B2 * | 8/2007 | Caresosa et al. | 330/254 |

\* cited by examiner

*Primary Examiner* — Dinh Le
(74) *Attorney, Agent, or Firm* — Jefferson IP Law, LLP

(57) ABSTRACT

An electronic circuit apparatus for compensating for a process variation of a resistor in an electronic circuit is provided. The electronic circuit includes a detecting part for generating a tune voltage corresponding to a process variation value of the at least one resistor, and a compensating part for compensating for a process variation of the at least one resistor using the tune voltage.

20 Claims, 13 Drawing Sheets

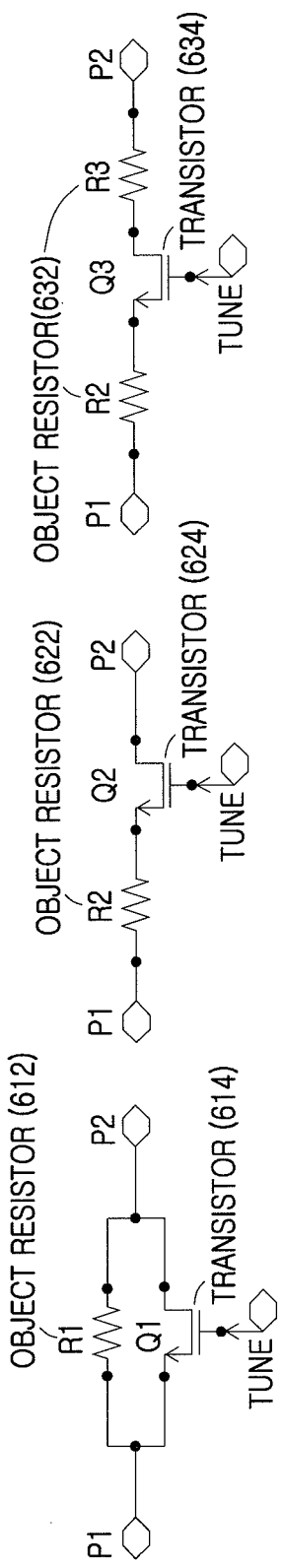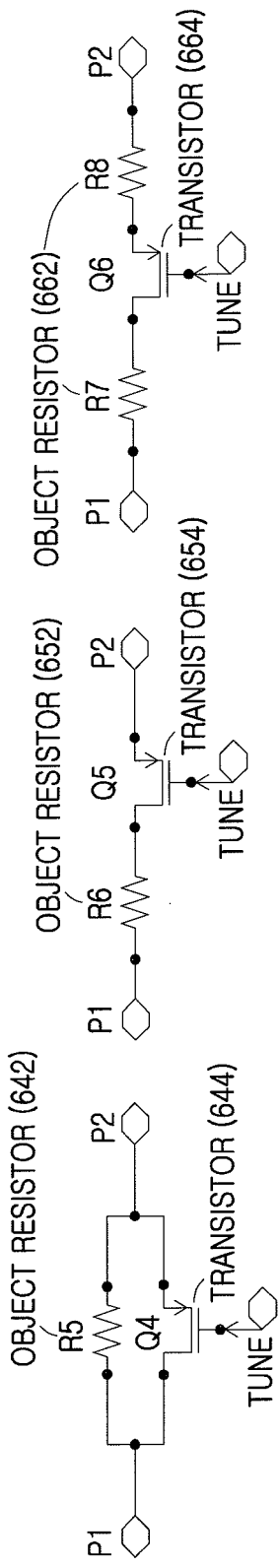

APPARATUS FOR COMPENSATING FOR PROCESS VARIATION OF RESISTOR IN ELECTRONIC CIRCUIT

PRIORITY

This application claims the benefit under 35 U.S.C. §119(a) of a Korean patent application filed in the Korean Intellectual Property Office on Oct. 11, 2010 and assigned Serial No. 10-2010-0098593, the entire disclosure of which is hereby incorporated by reference.

BACKGROUND OF THE INVENTION

1. Field of the Invention

The present invention relates to an electronic circuit. More particularly, the present invention relates to a device for compensating for a variation of a resistance value dependent on a production process in an electronic circuit.

2. Description of the Related Art

In an Integrated Circuit (IC) design using a semiconductor manufacturing process, inactive elements such as capacitors, resistors and the like as well as active elements such as P-type Metal Oxide Semiconductors (PMOSs) and N-type Metal Oxide Semiconductors (NMOSs) inevitably have variations due to the semiconductor manufacturing process. Particularly, the resistors have a non-negligible, and possibly large, process variation. A general commercialized semiconductor manufacturing process produces resistors having a resistance value variation of about ±15% to ±25% or so in a range of ±3σ (σ: standard deviation) according to a stability of a resistor forming technology and the semiconductor manufacturing process.

A process variation of a resistor occurring in the semiconductor manufacturing process is non-negligibly large. FIG. 1 illustrates a process variation of a resistor according to the related art. In detail, FIG. 1 illustrates an example of a resistance value provided in a Complementary Metal Oxide Semiconductor (CMOS) process. In FIG. 1, an X axis denotes a standard deviation of a process variation. Typically, the process variation of the resistor follows a normal distribution. FIG. 1 shows a resistance value variation of +22.0% to −21.5% compared to a nominal value at a deviation level of ±3σ.

The process variation of the resistor greatly affects the performance of a circuit including the resistor. For example, a mixer may be affected by the process variation as is described below.

FIG. 2 illustrates an example of an up-conversion mixer circuit according to the related art.

In FIG. 2, a resistor R1 210 performs the following roles. First, the resistor R1 210 increases a high frequency characteristic of a circuit and guarantees a required bandwidth. Second, the resistor R1 210 guarantees a gain that is insensitive to a variation of transistors Q1 to Q6. Third, the resistor R1 210 controls a gain value and allows a circuit to have suitable linearity when an input signal has a large magnitude. Lastly, the resistor R1 210 allows the intact acceptance of a magnitude of an output signal of a block located ahead by increasing an input resistance value.

As described above, the resistor R1 210 of FIG. 2 has an important function in the mixer circuit. However, owing to a resistance value variation resulting from the manufacturing process, a gain of the mixer is not constant, as illustrated in FIG. 3.

FIG. 3 is a graph illustrating a gain variation of an up-conversion mixer according to the related art.

Referring to FIG. 3, the gain has a range of about 3.75 dB from the minimum gain to the maximum gain. In a case where the gain decreases, power at a final output terminal decreases as well, resulting in a decrease in a reception distance. In a case where the gain increases, linearity decreases making it difficult to guarantee a Signal to Noise Ratio (SNR). However, a variation of a resistance value is dominant over a variation of the gain, even if considering other elements and a variation of temperature and source voltage. As a result, a throughput decreases or a calibration for overcoming this decrease in linearity is required. This results in an increase of the unit cost of a circuit, an increase of power consumption, and an increase of a volume.

As described above, due to a variation of a resistance value dependent on a manufacturing process, there occurs a problem of circuit throughput degradation, power consumption increase and the like. Accordingly, even though there is a process variation of a resistor, an alternative for minimizing a damage resulting from this should be proposed.

SUMMARY OF THE INVENTION

Aspects of the present invention are to address at least the above-mentioned problems and/or disadvantages and to provide at least the advantages described below. Accordingly, an aspect of the present invention is to provide a device for minimizing an effect that a process variation of a resistor has on a circuit in an electronic circuit.

Another aspect of the present invention is to provide a device for measuring a process variation of a resistor in an electronic circuit.

A further aspect of the present invention is to provide a device for compensating for a process variation of a resistor in an electronic circuit.

The above aspects are addressed by providing a device for compensating for a process variation of a resistor in an electronic circuit.

In accordance with an aspect of the present invention, an electronic circuit device having at least one resistor is provided. The device includes a detecting part for generating a tune voltage corresponding to a process variation value of the at least one resistor, and a compensating part for compensating for a process variation of the at least one resistor using the tune voltage.

In accordance with another aspect of the present invention, a method for compensating for a process variation of a resistor in an electronic circuit is provided. The method includes generating a tune voltage corresponding to a process variation value of the resistor in the electronic circuit, converting the tune voltage into a compensating resistance value using a transistor that is coupled to the resistor having the process variation value, and summing the compensating resistance value with a resistance value of the resistor in the electronic circuit.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will become more apparent from the following description taken in conjunction with the accompanying drawings, in which:

FIGS. 6A to 6F are circuit diagrams illustrating a compensating part of a device for compensating for a process variation of a resistor in an electronic circuit according to an exemplary embodiment of the present invention;

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention are provided for purposes of illustration only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Exemplary embodiments of the present invention provide a technology for compensating for a process variation of a resistor in an electronic circuit.

Figure 4:
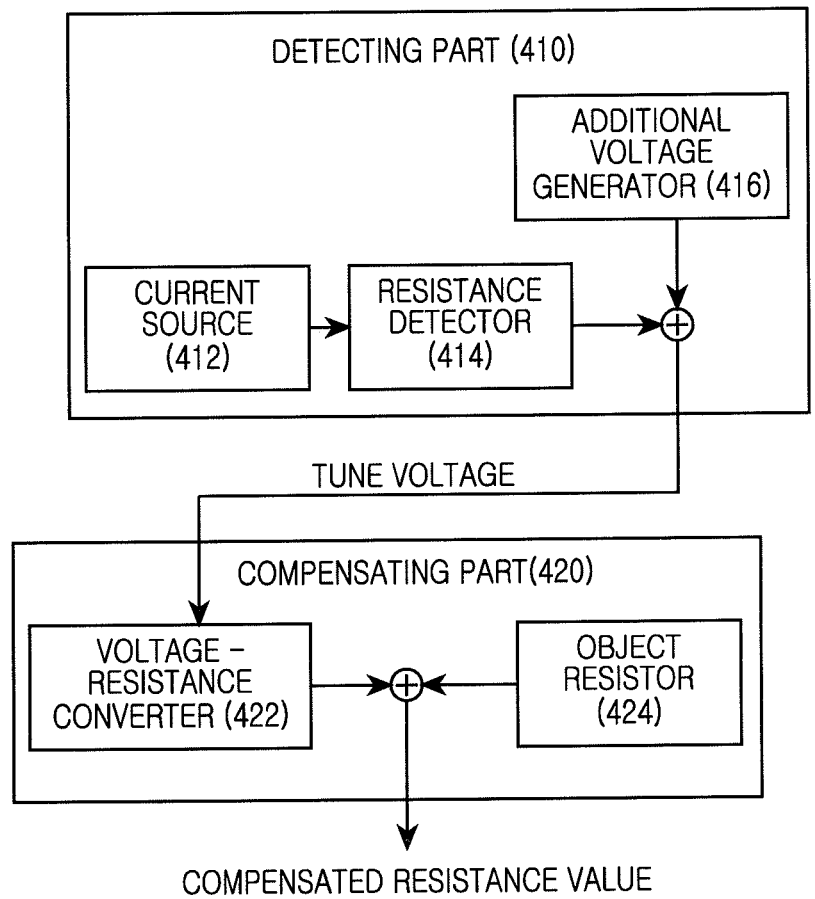
FIG. 4 is a block diagram illustrating a device for compensating for a process variation of a resistor in an electronic circuit according to an exemplary embodiment of the present invention.

FIG. 4 illustrates a block diagram of a device for compensating for a process variation of a resistor in an electronic circuit according to an exemplary embodiment of the present invention. Herein, the 'device for compensating for process variation of a resistor' is called a 'process-variation compensating device' for ease of description.

As illustrated in FIG. 4, the process-variation compensating device includes two blocks, a detecting part 410 and a compensating part 420.

The detecting part 410 generates a voltage (hereinafter, referred to as a 'tune voltage') corresponding to a process variation value of a resistor that is to be compensated for. That is, the detecting part 410 generates the voltage representing the process variation value by allowing the flow of a fixed current in a resistor having a same process variation value as the resistor intended to be compensated for. The detecting part 410 includes a current source 412, a resistance detector 414, and an additional voltage generator 416. The current source 412 provides a current for allowing the resistance detector 414 to generate a voltage value from a resistance value. The resistance detector 414 generates the tune voltage (i.e., the voltage corresponding to the process variation value of the resistor) using the fixed current from the current source 412. The additional voltage generator 416 optimizes a value of the tune voltage in order to improve operational performance of the compensating part 420. However, the additional voltage generator 416 is an optional constituent element which can be omitted in other exemplary embodiments of the present invention.

The compensating part 420 compensates for the process variation using the tune voltage. That is, by using a parallel or a series coupling of an element for converting the tune voltage into a resistance value and an object resistor that is an object of compensation, the compensating part 420 compensates for a process variation of the object resistor. In detail, the compensating part 420 includes a voltage to resistance converter 422 and an object resistor 424. The voltage to resistance converter 422 receives the tune voltage from the detecting part 410 and generates a resistance value corresponding to the tune voltage. The resistance value generated by the voltage to resistance converter 422 and a resistance value of the object resistor 424 are summed. Thus, a compensation for the process variation of the object resistor 424 is achieved.

Figure 5A:
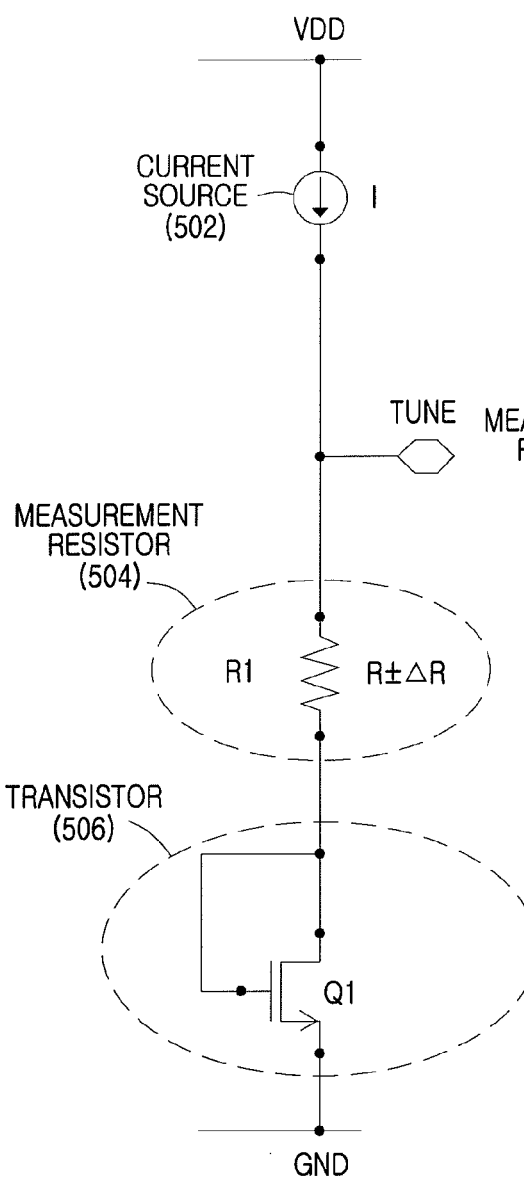
FIGS. 5A and 5B are circuit diagrams illustrating a detecting part of a device for compensating for a process variation of a resistor in an electronic circuit according to an exemplary embodiment of the present invention.
Figure 5B:
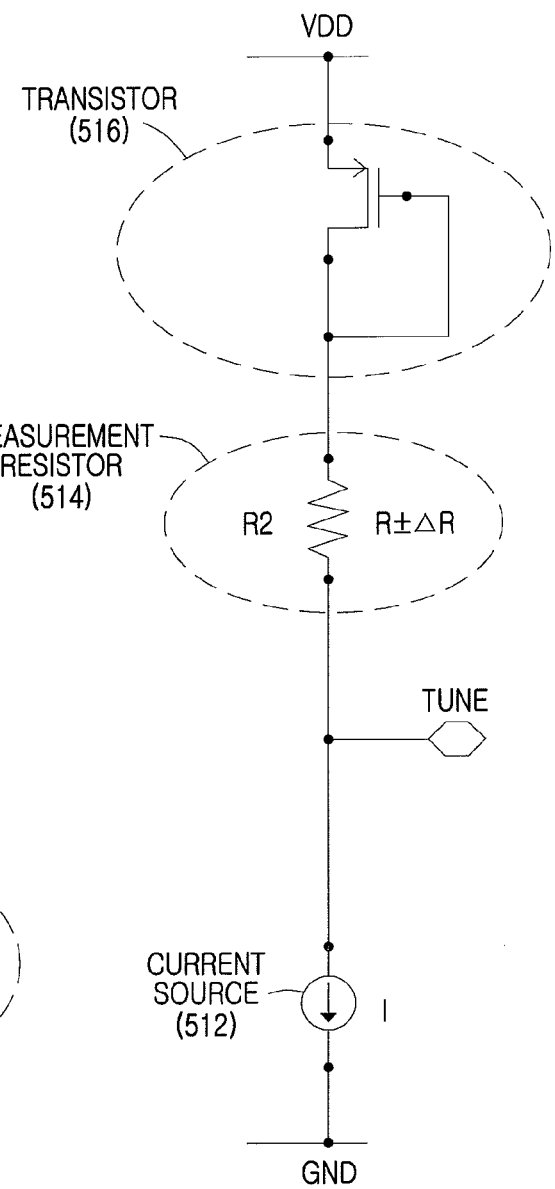

FIGS. 5A and 5B illustrate the detecting part 410 of a device for compensating for a process variation of a resistor in an electronic circuit according to an exemplary embodiment of the present invention. FIGS. 5A and 5B illustrate two exemplary embodiments of the detecting part 410.

Referring to FIG. 5A, the detecting part 410 includes a current source 502, a measurement resistor 504, and a transistor 506 that are successively coupled in series between a Voltage Drain Drain (VDD) and the Ground (GND). The transistor 506 is an N-type Metal Oxide Semiconductor (NMOS) transistor and is coupled at its source to the GND and at its drain to one end of the measurement resistor 504. The other end of the measurement resistor 504 is coupled to one end of the current source 502 and the other end of the current source 502 is coupled to the VDD. The current source 502 can be a general current mirror or any other suitable current source.

The measurement resistor 504 has the same process variation as the object resistor 424 included in the compensating part 420. For example, in a case where the measurement resistor 504 and the object resistor 424 are produced through a manufacturing process having the same technique, the measurement resistor 504 and the object resistor 424 can have the same process variation. A tune voltage is measured at a node between the current source 502 and the measurement resistor 504. The transistor 506 controls a value of the tune voltage so as to optimize an operation of the compensating part 420. However, the transistor 506 is an optional constituent element that can be omitted according to other exemplary embodiments of the present invention.

In FIG. 5A, the tune voltage is given as in Equation 1 below.

$$V_{TUNE}=I \cdot (R+\Delta R)+V_{GS}=IR+V_{GS}+I\Delta R \quad (1)$$

In Equation 1, '$V_{TUNE}$' denotes the tune voltage, 'I' denotes a generated current of the current source 502, 'R' denotes a design resistance value of the measurement resistor 504, '$\Delta R$' denotes a process variation resistance value of the measurement resistor 504, and '$V_{GS}$' denotes a Gate to Source voltage of the transistor 506.

Referring to Equation 1, 'I$\Delta R$' denotes a voltage value corresponding to a process variation, and 'IR+$V_{GS}$', wherein $V_{GS}$ is equal to a Drain to Source voltage ($V_{DS}$), denotes a Direct Current (DC) voltage value irrelevant to the process variation. However, the process variation resistance value $\Delta R$ of the measurement resistor 504 is a function of the design resistance value R, so the VGS is variable so as to optimize the DC voltage value IR+VGS irrelevant to the process variation. According to Equation 1, in FIG. 5A, the tune voltage $V_{TUNE}$ increases as the process variation resistance value $\Delta R$ of the measurement resistor 504 increases.

Referring to FIG. 5B, the detecting part 410 includes a transistor 516, a measurement resistor 514, and a current source 512 that are successively coupled in series between a VDD and the GND. The current source 512 can be a general current mirror or any other suitable current source. The transistor 516 is a P-type Metal Oxide Semiconductor (PMOS) transistor that is coupled at its source to the VDD and is coupled at its drain to one end of the measurement resistor 514. The other end of the measurement resistor 514 is coupled to one end of the current source 512. The other end of the current source 512 is coupled to the GND. The measurement resistor 514 has the same process variation as the object resistor 424 included in the compensating part 420. For example, in a case where the measurement resistor 514 and the object resistor 424 are produced through a manufacturing process of the same technique, they can have the same process variation. A tune voltage is measured at a node between the current source 512 and the measurement resistor 514. The transistor 516 controls a value of the tune voltage so as to optimize an operation of the compensating part 420. How-ever, the transistor 516 is an optional constituent element and can be omitted according to other exemplary embodiments.

In FIG. 5B, the tune voltage is given as in Equation 2 below.

$$V_{TUNE}=VDD-I \cdot (R+\Delta R)+V_{GS}=VDD-IR+V_{GS}-I\Delta R \quad (2)$$

In Equation 2, 'VDD' denotes an input voltage, '$V_{TUNE}$' denotes the tune voltage, 'I' denotes a generated current of the current source 512, 'R' denotes a design resistance value of the measurement resistor 514, '$\Delta R$' denotes a process variation resistance value of the measurement resistor 514, and '$V_{GS}$' denotes a Gate to Source voltage of the transistor 516.

Referring to Equation 2, 'I$\Delta R$' denotes a voltage value corresponding to a process variation, and 'IR+$V_{GS}$ (=$V_{DS}$)' denotes a DC voltage value irrelevant to the process variation. However, the process variation resistance value $\Delta R$ of the measurement resistor 514 is a function of the design resistance value R, such that the Gate to Source voltage $V_{GS}$, which is equal to $V_{DS}$, is variable so as to optimize the DC voltage value IR+VGS which is irrelevant to the process variation. According to Equation 2, in FIG. 5B, the tune voltage $V_{TUNE}$ decreases as the process variation resistance value $\Delta R$ of the measurement resistor 514 increases.

FIGS. 6A to 6F illustrate concrete examples of the compensating part 420 of a device for compensating for a process variation of a resistor in an electronic circuit according to an exemplary embodiment of the present invention. FIGS. 6A to 6F illustrate six exemplary implementations of the compensating part 420.

Referring to FIGS. 6A to 6F, each exemplary embodiment of the compensating part 420 includes an object resistor 612, 622, 632, 642, 652, and 662 and a transistor 614, 624, 634, 644, 654, and 664. Here, in FIGS. 6A to 6C, the transistors 614, 624, and 634 are NMOS type transistors and, in FIGS. 6D to 6F, the transistors 644, 654, and 664 are PMOS type transistors. The object resistors 612, 622, 632, 642, 652, and 662 are the resistors that are to be compensated for. The transistors 614, 624, 634, 644, 654, and 664 receive tune voltages at their gates. At this time, the transistors 614, 624, 634, 644, 654, and 664 operate in a linear region having a linear relationship between a Drain to Source voltage ($V_{DS}$) and a Drain current ($I_D$) and, according to linear relationship, generate resistance values corresponding to the tune voltages.

In a case where the transistors 614, 624, and 634 are NMOS type transistors, as in FIGS. 6A to 6C, characteristics of resistance values generated by the transistors 614, 624, and 634 are described as follows.

Figure 7:
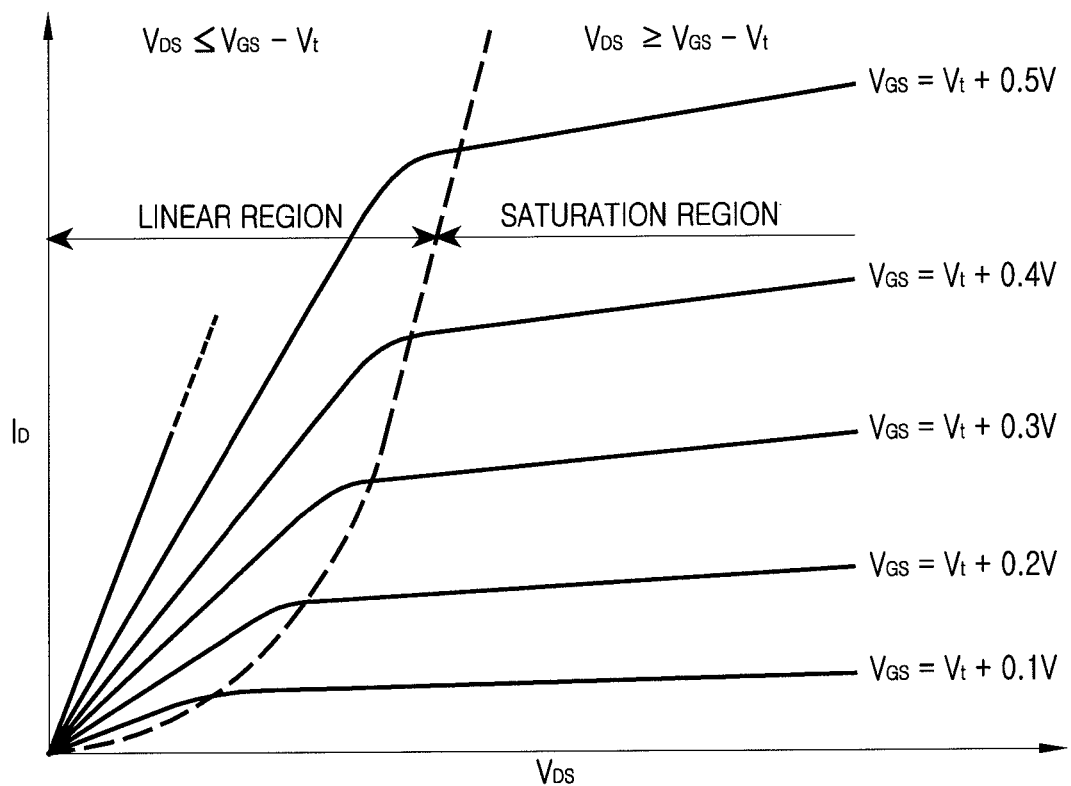
FIG. 7 is a graph illustrating a characteristic of an N-type Metal Oxide Semiconductor (NMOS) transistor according to an exemplary embodiment of the present invention.

FIG. 7 illustrates a characteristic of an NMOS transistor according to an exemplary embodiment of the present invention.

Referring to FIG. 7, a Drain to Source current $I_D$ varies depending on a variation of the Drain to Source voltage VDS. In a case where the NMOS transistor is used as an amplifier, the NMOS transistor is designed to operate in a saturation region. In a case where the NMOS transistor is used as a voltage to resistance converter according to the present exemplary embodiment, the NMOS transistor operates in a linear region.

As illustrated in FIG. 7, in the linear region, with respect to a constant Gate to Source voltage $V_{GS}$, the relationship of $I_D$ and $V_{DS}$ is expressed as a straight line having a constant slope. The slope of the straight line is $I_D/V_{DS}$, and is expressed as $1/R_{DS}$, wherein $R_{DS}$ is a Drain to Source resistance Accordingly, an inverse number of the slope $1/R_{DS}$ is equal to a resistance value $R_{DS}$ generated by the transistor 614, 624, or 634. Also, the $V_{GS}$ is the tune voltage applied to a gate of the transistor 614, 624, or 634. Accordingly, as the tune voltage increases, the resistance value generated by the transistor 614, 624, or 634 decreases.

In a case where the transistors 644, 654, and 664 are PMOS type transistors, as shown in FIGS. 6D to 6F, characteristics of resistance values generated by the transistors 644, 654, and 664 are described as follows.

Figure 8:
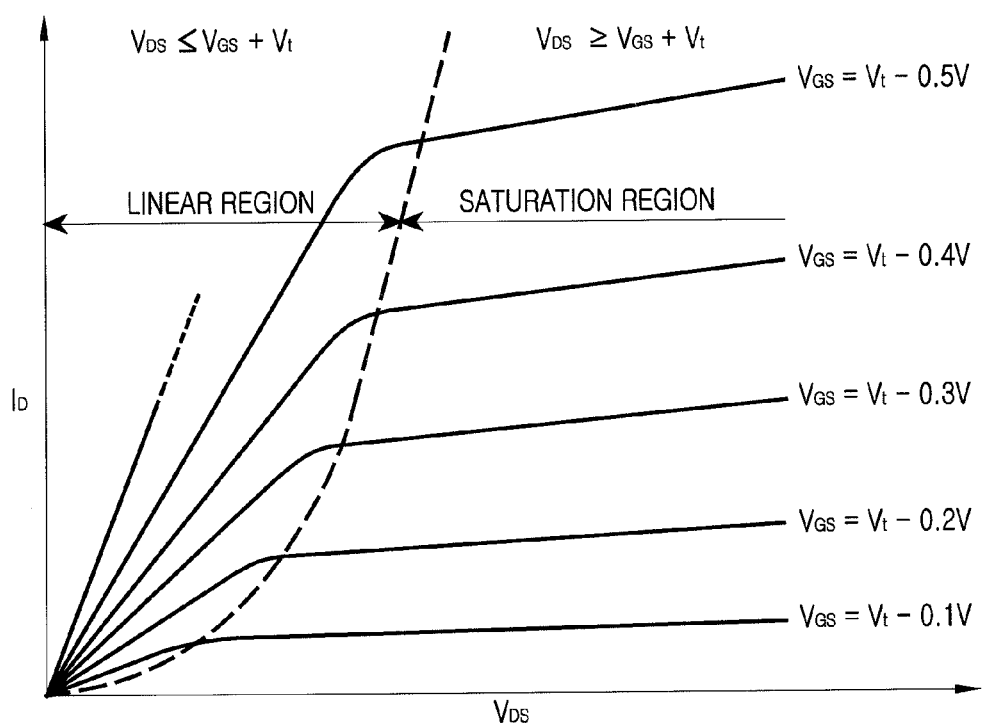
FIG. 8 is a graph illustrating a characteristic of a P-type Metal Oxide Semiconductor (PMOS) transistor according to an exemplary embodiment of the present invention.

FIG. 8 illustrates a characteristic of a PMOS transistor according to an exemplary embodiment of the present invention.

Referring to FIG. 8, a Drain to Source current $I_D$ varies depending on a variation of the Drain to Source voltage $V_{DS}$. In a case where the PMOS transistor is used as a voltage to resistance converter according to the present invention, the PMOS transistor operates in a linear region. As illustrated in FIG. 8, in the linear region, with respect to a constant Gate to Source voltage $V_{GS}$, the relationship of $I_D$ and $V_{DS}$ is expressed as a straight line having a constant slope. The slope of the straight line is $I_D/V_{DS}$, and is expressed as $1/R_{DS}$. Accordingly, an inverse number of the slope $1/R_{DS}$ is equal to a resistance value $R_{DS}$ generated by the transistor 644, 654, or 664. Also, the $V_{GS}$ is the tune voltage applied to a gate of the transistor 644, 654, or 664. Accordingly, as the tune voltage increases, the resistance value generated by the transistor 644, 654, or 664 increases.

In the description referring to FIGS. 7 and FIG. 8 above, in a case where the compensating part 420 employs the NMOS type transistor 614, 624, or 634, the resistance value generated by the transistor 614, 624, or 634 decreases as the tune voltage increases. In a case where the compensating part 420 employs the PMOS type transistor 644, 654, or 664, the resistance value generated by the transistor 644, 654, or 664 increases as the tune voltage increases. Accordingly, due to the series or parallel coupling between the object resistors 612, 622, 632, 642, 652, and 662 and the transistors 614, 624, 634, 644, 654, and 664, total resistance values between terminals P1 and terminals P2 vary according real resistance values of the object resistors 612, 622, 632, 642, 652, and 662. With this, compensation for process variations of the object resistor 612, 622, 632, 642, 652, and 662 is achieved.

Exemplary embodiments of the compensating part 420 illustrated in FIGS. 6A to 6F are described in detail as follows.

Referring to FIG. 6A, the compensating part 420 includes the object resistor 612 and the transistor 614 that are coupled in parallel. A tune voltage is applied to a gate of the transistor 614. Because the object resistor 612 and the transistor 614 are coupled in parallel, the total resistance value between the terminals P1 and P2 is less than a resistance value of the object resistor 612. In other words, the object resistor 612 is compensated for such that the resistance value decreases. Also, the transistor 614 is an NMOS type transistor, so a resistance value generated by the transistor 614 decreases as the tune voltage increases. Accordingly, it is desirable that the compensating part 420 uses the NMOS transistor 614, as shown in FIG. 6A, is used together with the detecting part 410 having a characteristic wherein a tune voltage gets larger as a process variation is larger, as shown in FIG. 5A.

Referring to FIG. 6B, the compensating part 420 includes the object resistor 622 and the transistor 624 that are coupled in series. A tune voltage is applied to a gate of the transistor 624. Because the object resistor 622 and the transistor 624 are coupled in series, a total resistance value between the terminals P1 and P2 is greater than a resistance value of the object resistor 622. In other words, the object resistor 622 is compensated for such that the resistance value increases. Also, the transistor 624 is an NMOS type transistor, so a resistance value generated by the transistor 624 decreases as the tune voltage increases. Accordingly, the compensating part 420 using the NMOS transistor 624, as shown in FIG. 6B, is used together with the detecting part 410 having a characteristic wherein a tune voltage becomes larger as the process variation becomes larger as in FIG. 5A.

Referring to FIG. 6C, the compensating part 420 includes two series-coupled object resistors 632 and a transistor 634 coupled in series between the two object resistors 632. A tune voltage is applied to a gate of the transistor 634. Because the two object resistors 632 and the transistor 634 are coupled in series, a total resistance value between the terminals P1 and P2 is greater than resistance values of the object resistors 632. In other words, the object resistors 632 are compensated for such that the resistance value increases. Also, the transistor 634 is an NMOS type transistor, so a resistance value generated by the transistor 634 decreases as the tune voltage increases. Accordingly, it is desirable that the compensating part 420 using the NMOS transistor 634, as shown in FIG. 6C, is used together with the detecting part 410 having a characteristic wherein a tune voltage becomes larger as a process variation becomes larger, as shown in FIG. 5A. Furthermore, the resistors 632 have a symmetric form, as shown in FIG. 6C, so the compensating part 420 can be used in a differential circuit, i.e., a symmetric circuit structure.

Referring to FIG. 6D, the compensating part 420 includes the object resistor 642 and the transistor 644 that are coupled in parallel. A tune voltage is applied to a gate of the transistor 644. Because the object resistor 642 and the transistor 644 are coupled in parallel, the total resistance value between the terminals P1 and P2 is less than a resistance value of the object resistor 642. In other words, the object resistor 642 is compensated for such that the resistance value decreases. Also, the transistor 644 is a PMOS type transistor, so a resistance value generated by the transistor 644 increases as the tune voltage increases. Accordingly, the compensating part 420 using the PMOS transistor 644, as shown in FIG. 6D, is used together with the detecting part 410 having a characteristic wherein a tune voltage becomes smaller as a process variation becomes larger, as seen in FIG. 5B.

Referring to FIG. 6E, the compensating part 420 includes the object resistor 652 and the transistor 654 that are coupled in series. A tune voltage is applied to a gate of the transistor 654. Because the object resistor 652 and the transistor 654 are coupled in series, the total resistance value between the terminals P1 and P2 is greater than a resistance value of the object resistor 652. In other words, the object resistor 652 is compensated for such that the resistance value increases. Also, the transistor 654 is a PMOS type transistor, so a resistance value generated by the transistor 654 increases as the tune voltage increases. Accordingly, the compensating part 420 using the PMOS transistor 654, as shown in FIG. 6E, is used together with the detecting part 410 having a characteristic wherein a tune voltage becomes smaller as a process variation becomes larger, as shown in FIG. 5B.

Referring to FIG. 6F, the compensating part 420 includes the two series-coupled object resistors 662 and the transistor 664 coupled in series between the two object resistors 662. A tune voltage is applied to a gate of the transistor 664. Because the object resistors 662 and the transistor 664 are coupled in series, a total resistance value between the terminals P1 and P2 is greater than resistance values of the object resistors 662. In other words, the object resistors 662 are compensated for such that the resistance value increases. Also, the transistor 664 is a PMOS type transistor, so a resistance value generated by the transistor 664 increases as the tune voltage increases. Accordingly, the compensating part 420 using the PMOS transistor 664, as shown in FIG. 6F, is used together with the detecting part 410 having a characteristic wherein a tune voltage becomes smaller as a process variation becomes larger as in FIG. 5B. Further, the resistors 662 have a symmetric form, as shown in FIG. 6F, so the compensating part 420 can be used in a differential circuit, i.e., a symmetric circuit structure.

Figure 9:
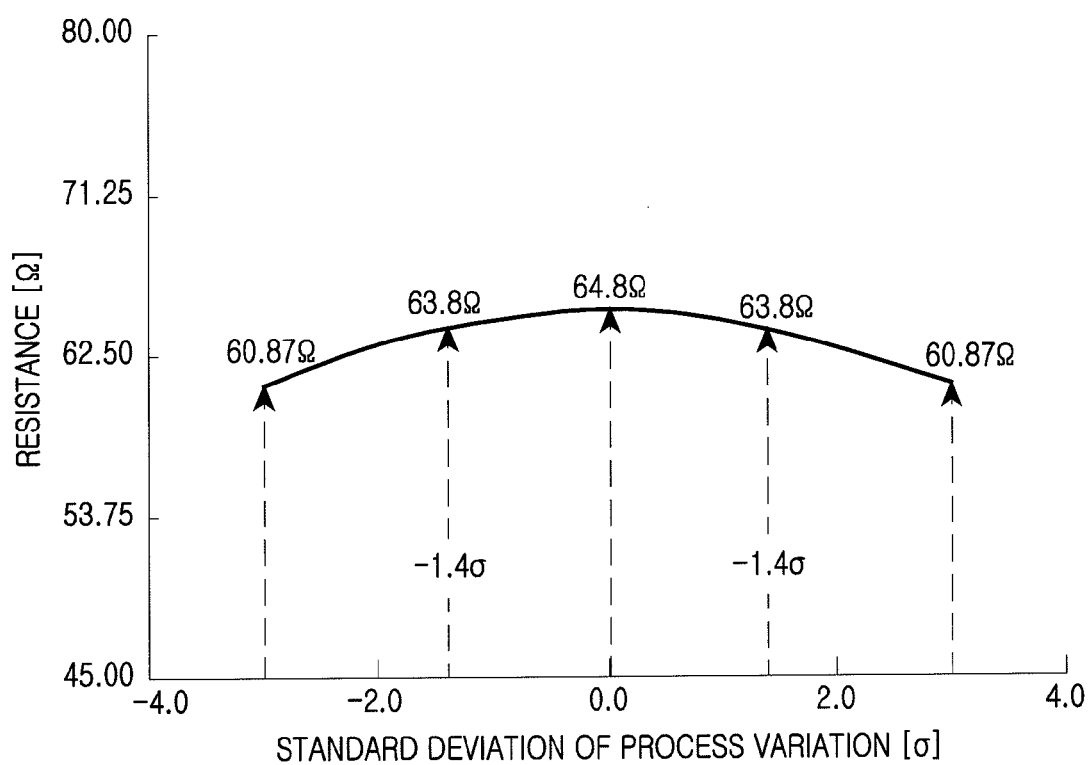
FIG. 9 is a graph illustrating a process variation of a resistor that is compensated for according to an exemplary embodiment of the present invention.

FIG. 9 illustrates a process variation of a resistor that is compensated for according to an exemplary embodiment of the present invention. FIG. 9 illustrates a simulation result of a process-variation compensating device such as a detecting part illustrated in FIG. 5A and a compensating part illustrated in FIG. 6A.

Figure 1:
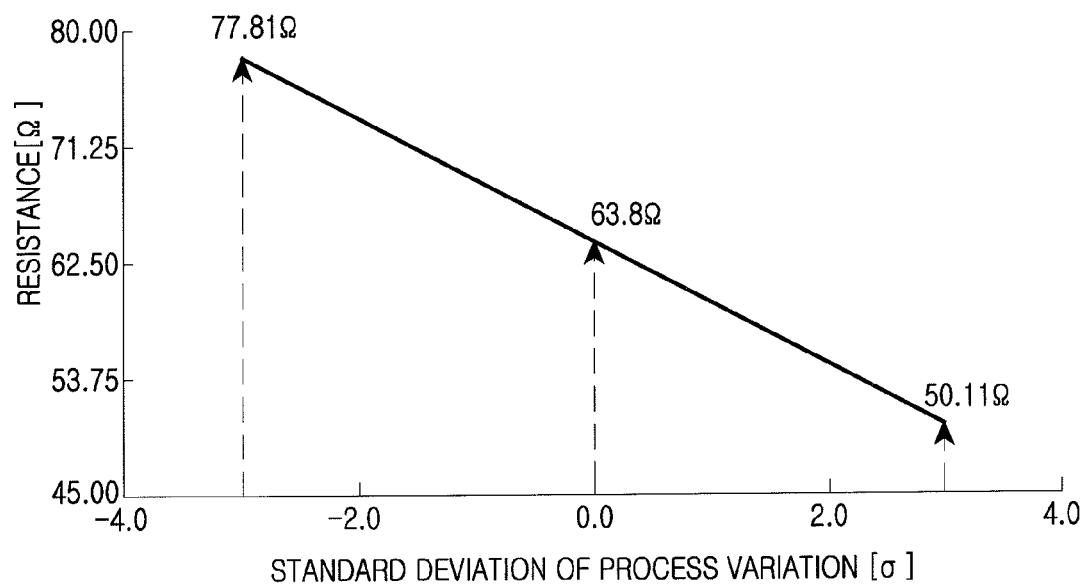
FIG. 1 is a graph illustrating a process variation of a resistor according to the related art.

In comparing FIG. 9 with FIG. 1, which illustrates a process variation of a resistor according to the related art, the related art resistor has a very large resistance value variation of −21.5% to +22.0% compared to a nominal resistance value. In contrast, as shown in FIG. 9, a resistor compensated according to the present exemplary embodiments has a remarkably small resistance value variation of −4.6% to +1.6% when a nominal resistance value is equal to ±1.4σ. That is, FIG. 9 illustrates that the present exemplary embodiments have an effect of compensating for a process variation.

As described above, the process-variation compensating device according to the present exemplary embodiments includes the detecting part and the compensating part. The process-variation compensating device can be applied to all electronic circuits using resistors. In detail, the process-variation compensating device can be applied, by adding the detecting part to a circuit employing a resistor and substituting the compensating part for a resistor becoming an object of compensation. Further examples of a circuit applying the process-variation compensating device are described below with reference to the drawings.

Figure 10:
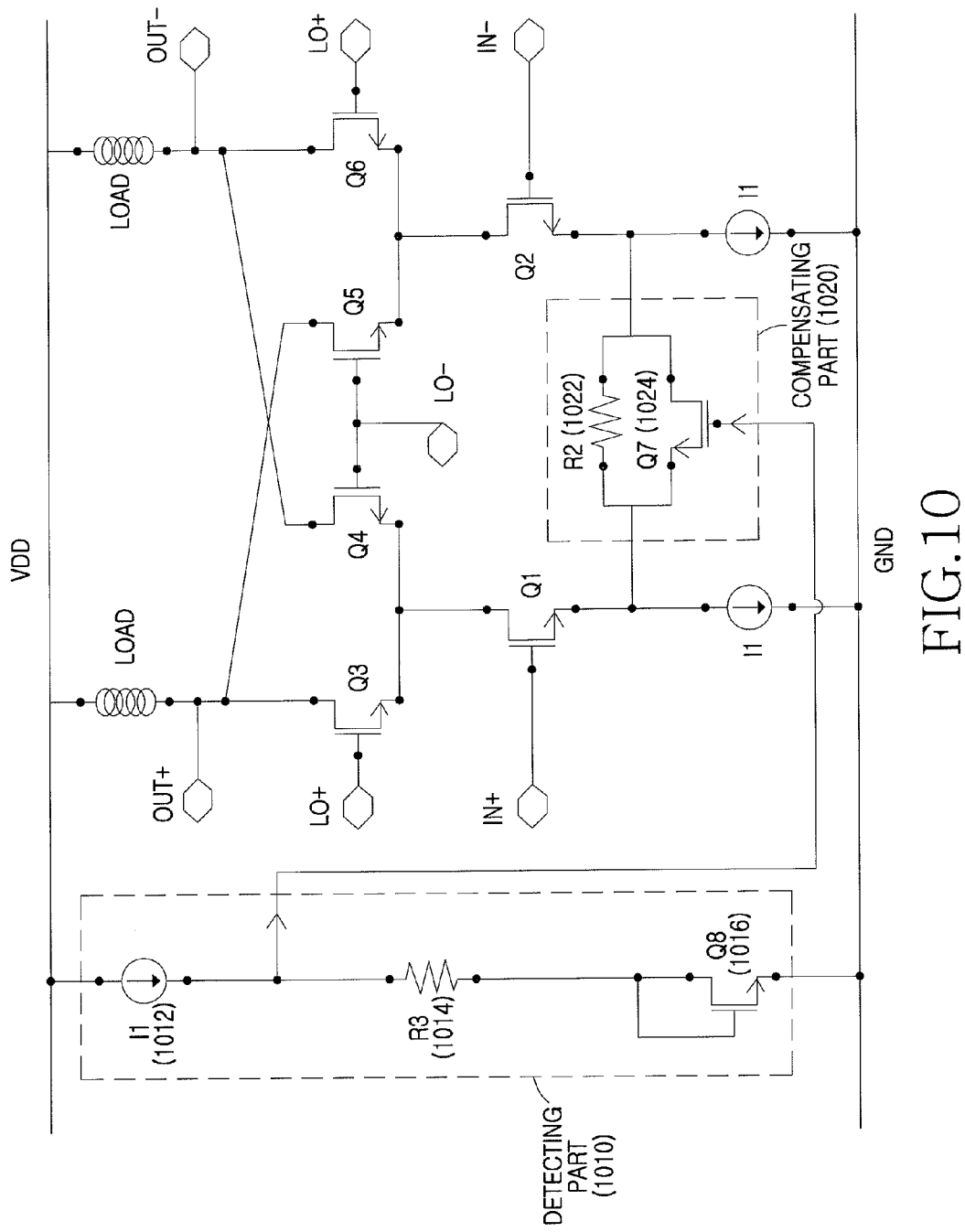
FIG. 10 is a circuit diagram illustrating an up-conversion mixer including a device for compensating for a process variation of a resistor according to an exemplary embodiment of the present invention.

FIG. 10 illustrates an up-conversion mixer including a device for compensating for a process variation of a resistor according to an exemplary embodiment of the present invention. FIG. 10 illustrates an exemplary implementation in which a process-variation compensating device is applied to an up-conversion mixer circuit of FIG. 2.

Figure 2:
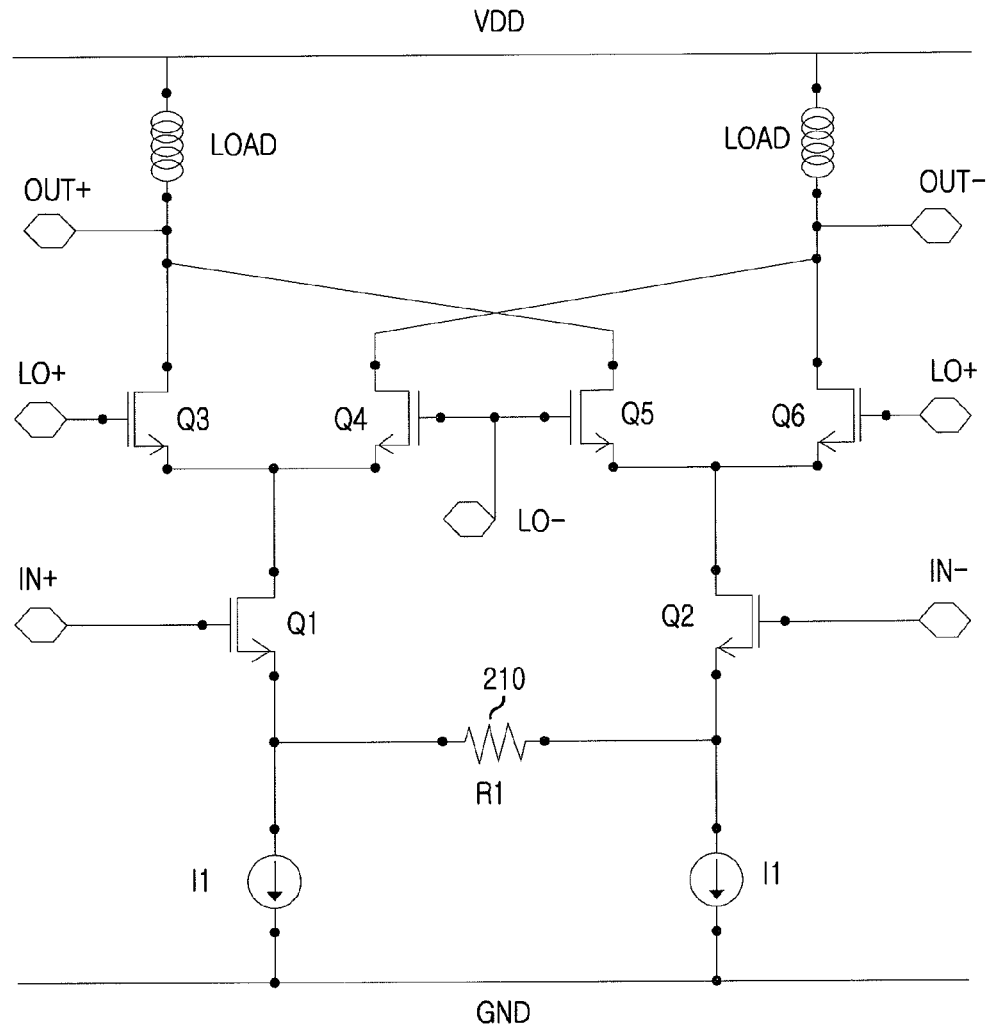
FIG. 2 is a circuit diagram illustrating an example of an up-conversion mixer circuit according to the related art.

In comparing FIG. 10 with FIG. 2, the up-conversion mixer of FIG. 10 further includes a detecting part 1010, and a compensating part 1020, which is substituted for the resistor R1 210 of FIG. 2. The detecting part 1010 has a structure of the detecting part illustrated in FIG. 5A, and the compensating part 1020 has a structure of the compensating part illustrated in FIG. 6A. In detail, the up-conversion mixer of FIG. 10 is formed by successively coupling a current source I1 1012, a resistor R3 1014, and a transistor Q8 1016 in series between a VDD and a GND, by excluding the resistor R1 210 (see FIG. 2), and by coupling a resistor R2 1022 and a transistor Q7 1024 in parallel at a location of the resistor R1 210, and by coupling a node between the current source I1 1012 and the resistor R3 1014 with a gate of the transistor Q7 1024, as shown in the circuit of FIG. 10. The resistor R2 1022 has a greater resistance value than the resistor R1 210 in order for the up-conversion mixer of FIG. 2 and the up-conversion mixer of FIG. 10 to have the same gain. This is because a resistance value after compensation decreases owing to the parallel coupling between the resistor R2 1022 and the transistor Q7 1024.

Referring to FIG. 10, the detecting part 1010, which is the part of the up-conversion mixer, shares the VDD and the GND with the up-conversion mixer, but the detecting part 1010 can be constructed as a circuit coupled to a separate VDD and GND. However, although the detecting part 1010 is constructed separately, tune power measured in the detecting part 1010 should be input to the gate of the transistor Q7 1024 of the compensating part 1020.

Figure 11:
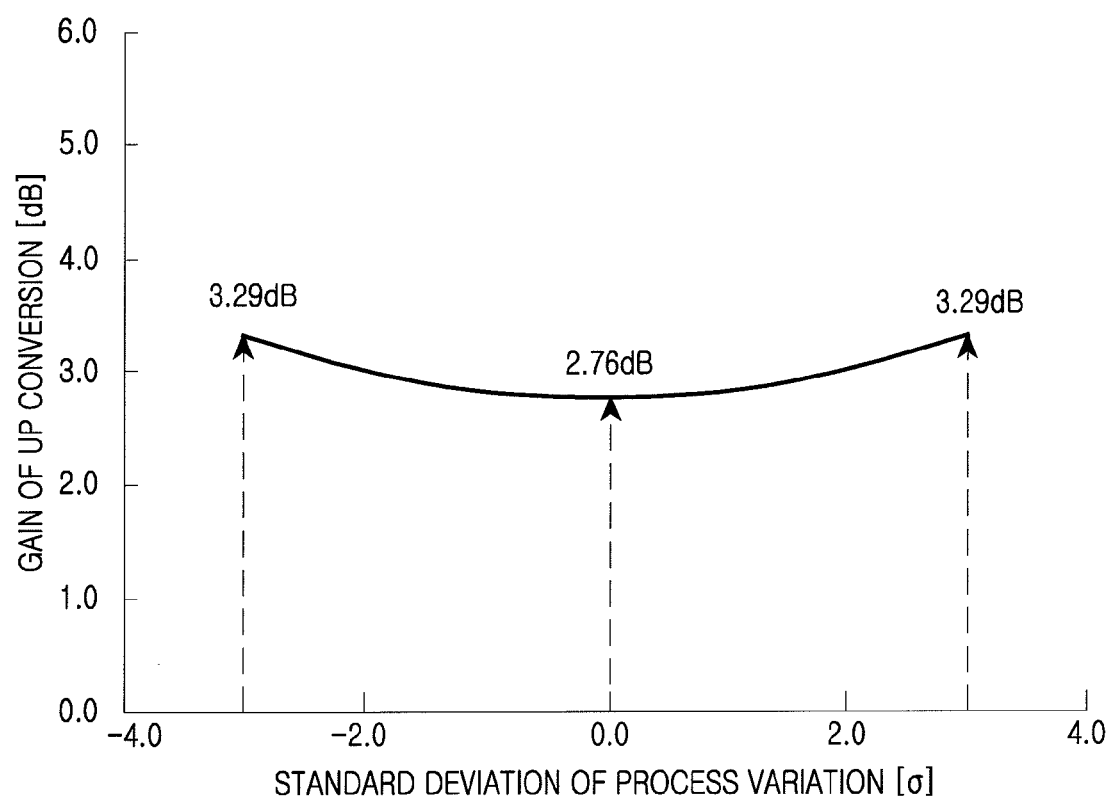
FIG. 11 is a graph illustrating a gain variation of an up-conversion mixer applying a device for compensating for a process variation of a resistor according to an exemplary embodiment of the present invention.

FIG. 11 illustrates a gain variation of an up-conversion mixer applying a device for compensating for a process variation of a resistor according to an exemplary embodiment of the present invention. FIG. 11 illustrates a gain variation of the up-conversion mixer of FIG. 10.

Figure 3:
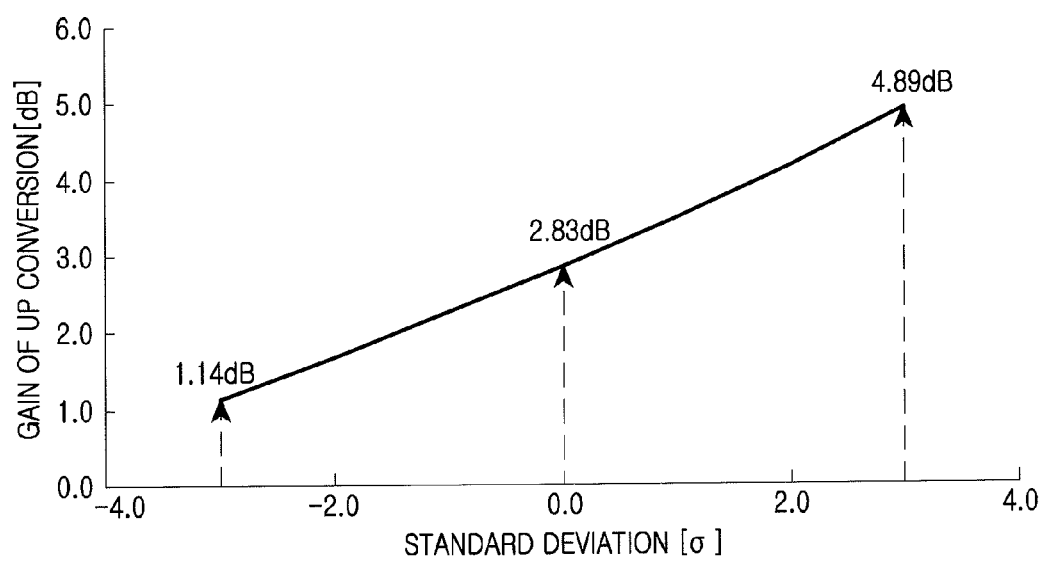
FIG. 3 is a graph illustrating a gain variation of an up-conversion mixer according to the related art.

In comparing FIG. 11 with FIG. 3, which illustrates a gain variation of an up-conversion mixer according to the related art, the related art up-conversion mixer of FIG. 3 has a large gain variation of about 3.7 dB in accordance with a process variation of a resistor. In contrast, the up-conversion mixer of FIG. 11, which includes a compensated resistor, has an improved gain variation of about 0.5 dB. Due to a decrease of the gain variation, as illustrated in FIG. 11, the up-conversion mixer is expected to have an improved throughput and also, due to the omission of a calibration procedure, a test cost saving effect is expected.

Figure 12:
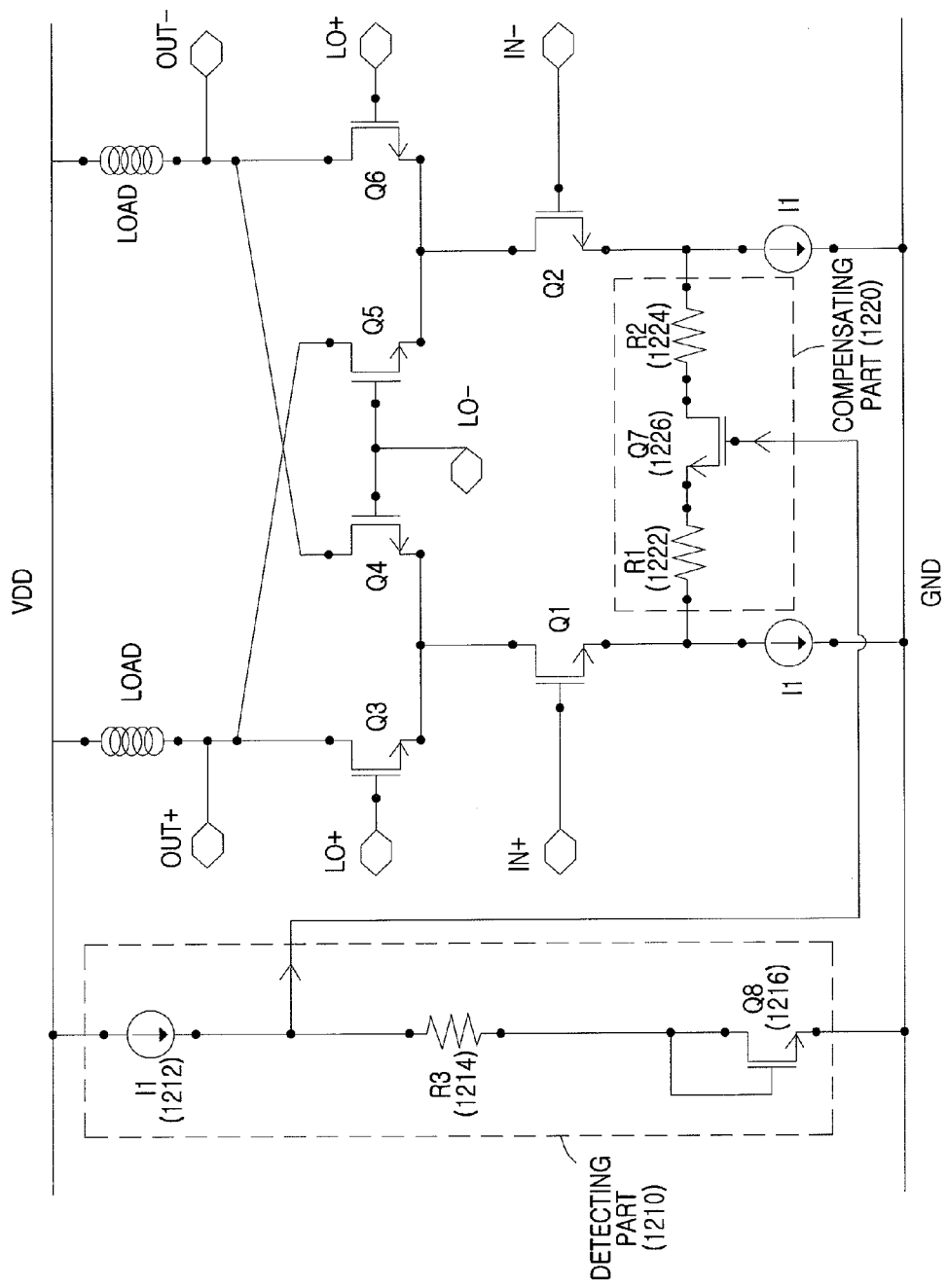
FIG. 12 is a circuit diagram illustrating an up-conversion mixer applying a device for compensating for a process variation of a resistor according to another exemplary embodiment of the present invention.

FIG. 12 illustrates an up-conversion mixer applying a device for compensating for a process variation of a resistor according to another exemplary embodiment of the present invention. Unlike FIG. 10, FIG. 12 illustrates a case of using a compensator illustrated in FIG. 6C.

In detail, the up-conversion mixer of FIG. 12 is formed by successively coupling a current source I1 1212, a resistor R3 1214, and a transistor Q8 1216 in series between a VDD and a GND, and by excluding the resistor R1 210 (see FIG. 2), by coupling a resistor R1 1222, a resistor R2 1224, and a transistor Q7 1226 in series so as to be a group of elements coupled in parallel at a location of the resistor R1 210, and by coupling a node between the current source I2 1212 and the resistor R3 1214 with a gate of the transistor Q7 1226.

Referring to FIG. 12, the detecting part 1210, which is part of the up-conversion mixer, is formed so as to share the VDD and the GND with the up-conversion mixer, but the detecting part 1210 may be formed as a circuit coupled to a separate VDD and a GND. However, although the detecting part 1210 is formed separately, tune power measured in the detecting part 1210 should be input to the gate of the transistor Q7 1226 of the compensating part 1220.

Figure 13:
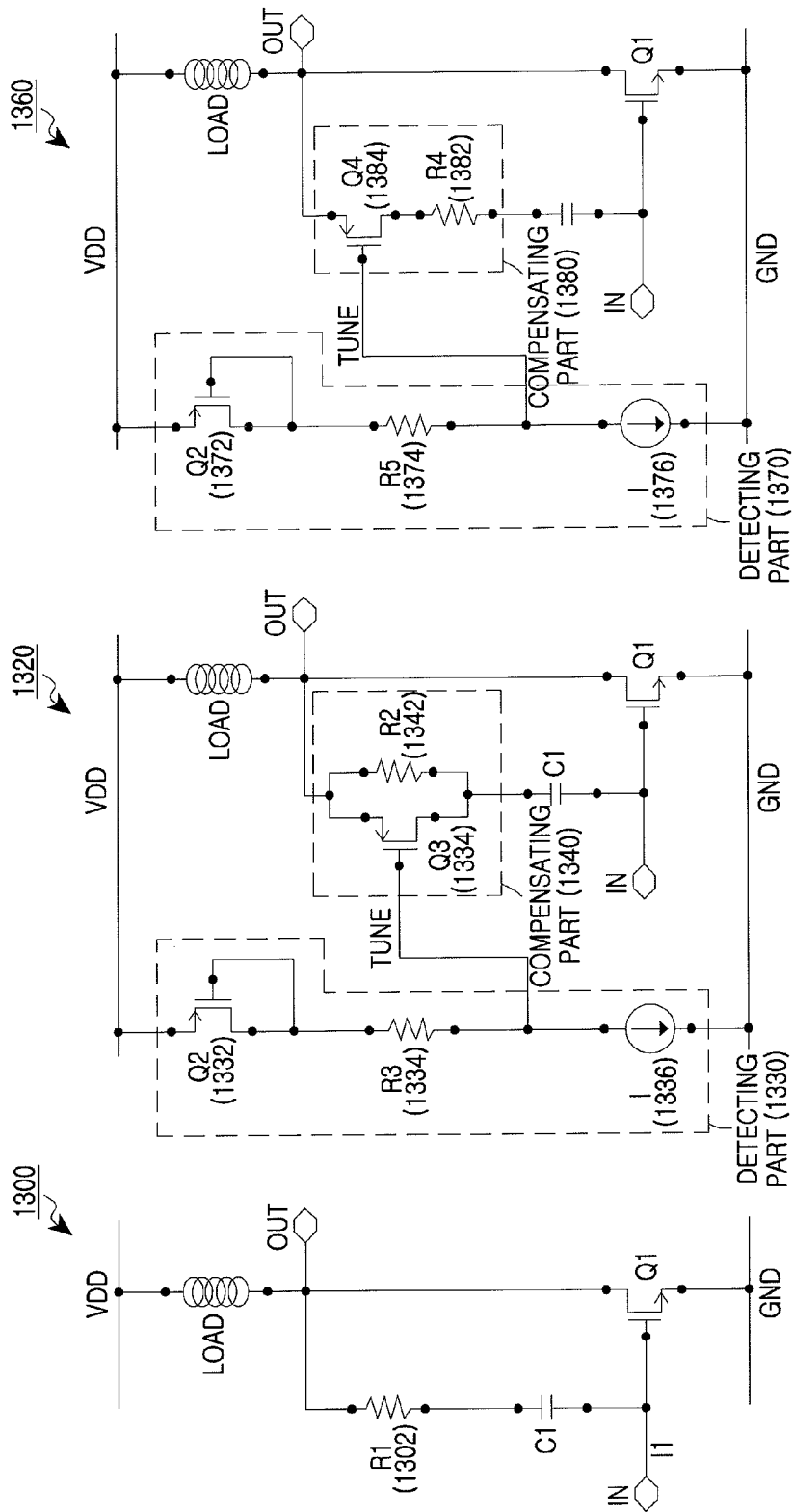
FIG. 13 is a diagram illustrating a feedback circuit applying a device for compensating for a process variation of a resistor according to an exemplary embodiment of the present invention.

FIG. 13 illustrates a feedback circuit including a device for compensating for a process variation of a resistor according to an exemplary embodiment of the present invention. FIG. 13 illustrates a related art feedback circuit 1300, a first feedback circuit 1320 including a process-variation compensating device according to an exemplary embodiment of the present invention, and a second feedback circuit 1360 including a process-variation compensating device according to another exemplary embodiment of the present invention.

Compared to the related art feedback circuit 1300, the first feedback circuit 1320 further includes a detecting part 1330, and a compensating part 1340, which is substituted for a resistor R1 1302 of the related art feedback circuit 1300. The detecting part 1330 has a structure of the detecting part illustrated in FIG. 5B, and the compensating part 1340 has a structure of the compensating part illustrated in FIG. 6D. In detail, the first feedback circuit 1320 is formed by successively coupling a transistor Q2 1332, a resistor R3 1334, and a current source I 1336 in series between a VDD and a GND, by excluding the resistor R1 1302 of the related art feedback circuit 1300, by coupling a resistor R2 1342 and a transistor Q3 1344 in parallel at a location of the resistor R1 1302, and by coupling a node between the current source I 1336 and the resistor R3 1334 with a gate of the transistor Q3 1344.

Compared to the related art feedback circuit 1300, the second feedback circuit 1360 further includes a detecting part 1370, and a compensating part 1380 substituted for the resistor R1 1302 of the related art feedback circuit 1300. At this time, the detecting part 1370 has a structure of the detecting part of FIG. 5B, and the compensating part 1380 has a structure of the compensating part FIG. 6E. In detail, the 2nd feedback circuit 1360 is constructed, by successively coupling a transistor Q2 1372, a resistor R5 1374, and a current source I 1376 in series between a VDD and a GND, by excluding the resistor R1 1302 of the feedback circuit 1300, by coupling a resistor R4 1382 and a transistor Q4 1384 in series such that the group including the resistor R4 1382 and the transistor Q4 1384 is coupled in parallel at the location of the resistor R1 1302, and by coupling a node between the current source I 1376 and the resistor R5 1374 with a gate of the transistor Q4 1384.

As described above, exemplary embodiments of the present invention can prevent performance degradation resulting from a process variation resulting from manufacturing processes by using a circuit having a low power consumption and a small size, by measuring the process variation using a current source and a transistor, and compensating for the process variation through a transistor operating in a linear region in an electronic circuit.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An electronic circuit apparatus having at least one resistor, the apparatus comprising:
    a detecting part for generating a tune voltage corresponding to a process variation value of the at least one resistor; and
    a compensating part for compensating for the process variation value of a first resistor by applying the tune voltage to at least one transistor which operates in a linear region,
    wherein a drain to source voltage of the at least one transistor is substantially zero, and
    wherein the detecting part comprises a second resistor and a current source which provides a fixed current.

2. The apparatus of claim 1, wherein the detecting part comprises the current source, the second resistor and a transistor that are coupled in series.

3. The apparatus of claim 1, wherein the second resistor has a same process variation as the at least one resistor.

4. The apparatus of claim 2, wherein the tune voltage is a voltage measured at a node coupling the current source to the second resistor.

5. The apparatus of claim 2, wherein the transistor is an N-type Metal Oxide Semiconductor (NMOS) transistor,
    wherein a source port of the transistor is coupled to a Ground (GND),
    wherein a drain port of the transistor is coupled one end of the second resistor,
    wherein another end of the second resistor is coupled to one end of the current source,
    wherein another end of the current source is coupled to a Voltage Drain Drain ($V_{DD}$), and
    wherein the tune voltage is a value that is a sum of a Drain to Source voltage ($V_{Ds}$) of the transistor and a voltage applied to the second resistor.

6. The apparatus of claim 2, wherein the transistor is a P-type Metal Oxide Semiconductor (PMOS) transistor,
    wherein a source port of the transistor is coupled to a Voltage Drain Drain ($V_{DD}$),
    wherein a drain port of the transistor is coupled to one end of the second resistor,
    wherein another end of the second resistor is coupled to one end of the current source,
    wherein another end of the current source is coupled to a Ground (GND), and
    wherein the tune voltage is a value subtracting a Drain to Source voltage ($V_{Ds}$) of the transistor and a voltage applied to the second resistor from the VDD.

7. The apparatus of claim 1, wherein the compensating part comprises the at least one transistor and the at least one resistor.

8. The apparatus of claim 7, wherein the tune voltage is applied to a gate port of the at least one transistor.

9. The apparatus of claim 8, wherein the at least one transistor is an N-type Metal Oxide Semiconductor (NMOS) transistor, and is coupled in parallel with the at least one resistor.

10. The apparatus of claim 8, wherein the at least one transistor is an N-type Metal Oxide Semiconductor (NMOS) transistor, and is coupled in series with the at least one resistor.

11. The apparatus of claim 8, wherein the at least one resistor comprises an even number of resistors,
    wherein the even number of resistors are symmetrically disposed centering on the at least one transistor, and
    wherein the at least one transistor is an N-type Metal Oxide Semiconductor (NMOS) transistor, and is coupled in series with the at least one resistor.

12. The apparatus of claim 8, wherein the at least one transistor is a P-type Metal Oxide Semiconductor (PMOS) transistor, and is coupled in parallel with the at least one resistor.

13. The apparatus of claim 8, wherein the at least one transistor is a P-type Metal Oxide Semiconductor (PMOS) transistor, and is coupled in series with the at least one resistor.

14. The apparatus of claim 8, wherein the at least one resistor comprises an even number of resistors,
    wherein the even number of resistors are symmetrically disposed centering on the at least one transistor, and
    wherein the at least one transistor is a P-type Metal Oxide Semiconductor (PMOS) transistor, and is coupled in series with the at least one resistor.

15. The apparatus of claim 1, wherein a current from the current source flows through the second resistor, and
    wherein the tune voltage is outputted at a port of the second resistor.

16. A method for compensating for a process variation of a first resistor in an electronic circuit, the method comprising:
    generating a tune voltage corresponding to a process variation value of the first resistor in the electronic circuit using a detecting circuit comprising a second resistor and a current source which provides a fixed current;
    converting the tune voltage into a compensating resistance value using a transistor that is coupled to the first resistor having the process variation value by applying the tune voltage to the transistor which operates in a linear region, wherein a drain to source voltage of the at least one transistor is substantially zero; and
    summing the compensating resistance value with a resistance value of the first resistor in the electronic circuit.

17. The method of claim 16, wherein the generating of the tune voltage comprises:

generating a current flowing through the second resistor having a same process variation value as that of the first resistor in the electronic circuit in order to generate an initial tune voltage;

generating an additional voltage;

adding the additional voltage to the initial tune voltage in order to generate the tune voltage.

18. The method of claim 16, wherein the converting of the tune voltage into the compensating resistance value comprises:

generating a resistance value corresponding to the tune voltage;

adding the generated resistance value to a resistance value of the first resistor in the electronic circuit in order to generate the compensating resistance value.

19. The method of claim 18, wherein the generating of the resistance value corresponding to the tune voltage is performed by a transistor that is coupled in parallel or in series to the first resistor in the electronic circuit.

20. The method of claim 16, wherein a current from the current source flows through the second resistor, and wherein the tune voltage is outputted at a port of the second resistor.

* * * * *